United States Patent
Goya et al.

(10) Patent No.: US 8,481,848 B2
(45) Date of Patent: Jul. 9, 2013

(54) PHOTOVOLTAIC DEVICE

(75) Inventors: Saneyuki Goya, Kanagawa (JP); Eishiro Sasakawa, Nagasaki (JP); Hiroshi Mashima, Nagasaki (JP); Satoshi Sakai, Kanagawa (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 580 days.

(21) Appl. No.: 12/670,557

(22) PCT Filed: Jan. 7, 2009

(86) PCT No.: PCT/JP2009/050094
§ 371 (c)(1),
(2), (4) Date: Jan. 25, 2010

(87) PCT Pub. No.: WO2009/119124
PCT Pub. Date: Oct. 1, 2009

(65) Prior Publication Data
US 2010/0206373 A1     Aug. 19, 2010

(30) Foreign Application Priority Data
Mar. 28, 2008 (JP) .................................. 2008-088593

(51) Int. Cl.
*H01L 31/00* (2006.01)

(52) U.S. Cl.
USPC .......................................... 136/261; 136/258

(58) Field of Classification Search
USPC .......................................... 136/252, 258, 261
See application file for complete search history.

(56) References Cited

U.S. PATENT DOCUMENTS

| 2002/0011264 A1* | 1/2002 | Saito .............................. 136/258 |
| 2006/0180196 A1* | 8/2006 | Lares et al. .................... 136/251 |
| 2007/0184191 A1 | 8/2007 | Takai et al. |

FOREIGN PATENT DOCUMENTS

| JP | 2237172 | 9/1990 |
| JP | 2005-123466 | 5/2005 |
| JP | 3943080 | 4/2007 |
| JP | 2007-227522 | 9/2007 |
| JP | 2008-066343 | 3/2008 |

(Continued)

OTHER PUBLICATIONS

Kondo et al "High rate growth of microcrystalline silicon at low temperatures", Journal of Non-Crystalline Solids, vols. 266-269, Part 1, May 2000 pp. 84-89.*

(Continued)

*Primary Examiner* — Alexander Kollias
(74) *Attorney, Agent, or Firm* — Kanesaka Berner & Partners, LLP

(57) ABSTRACT

A large surface area photovoltaic device having high conversion efficiency and excellent mass productivity is provided. A photovoltaic device 100 having a photovoltaic layer 3 comprising a crystalline silicon layer formed on a substrate 1, wherein the crystalline silicon layer has a crystalline silicon i-layer 42, and the crystalline silicon i-layer 42 has a substrate in-plane distribution represented by an average value for the Raman peak ratio, which represents the ratio of the Raman peak intensity for the crystalline silicon phase relative to the Raman peak intensity for the amorphous silicon phase, that is not less than 4 and not more than 8, a standard deviation for the Raman peak ratio that is not less than 1 and not more than 3, and a proportion of regions in which the Raman peak ratio is not more than 4 of not less than 0% and not more than 15%.

12 Claims, 8 Drawing Sheets

FOREIGN PATENT DOCUMENTS

| | | |
|---|---|---|
| WO | 2007111028 A1 | 10/2007 |
| WO | WO 2007/148569 | 12/2007 |
| WO | WO 2008/029716 | 3/2008 |

OTHER PUBLICATIONS

Dros et al "Relationship between Raman crystallinity and open-circuit voltage in microcrystalline silicon solar cells", Solar Energy Materials and Solar Cells, vol. 81, Issue 1, Jan. 24, 2004 pp. 61-71.*

Fukawa et al "High rate growth of microcrystalline silicon using a high-pressure depletion method with VHF plasma", Solar Energy Materials and Solar Cells, vol. 66, Issues 1-4, Feb. 2001, pp. 217-223.*

Chinese Office Action for CN 200980100131.4, issued Apr. 7, 2011.

Fujioka, Y., et al., "Large-Scale, High-Efficiency Thin-Film Silicon Solar Cells Fabricated by Short-Pulsed Plasma CVD Method", PVSEC 14th (Bangkok, Jan. 2004), pp. 3416-3421.

Office Action in corresponding Chinese Application No. 200980100131.4.

Takagi et al, "Large Area Multi-zone Type VHF-PCVD System for a-Si and μc-Si Deposition" 3rd Word Conference on Photovoltaic Energy Conversion, Published Jun. 28, 2004, vol. 2, pp. 1792-1795, Osaka, Japan.

A Notification on the Grant of Patent Right as issued on May 6, 2013 in corresponding Chinese Patent Application No. 20098010100131.4.

* cited by examiner

PHOTOVOLTAIC DEVICE

TECHNICAL FIELD

The present invention relates to a photovoltaic device, and relates particularly to a photovoltaic device in which the electric power generation layer is formed by deposition.

BACKGROUND ART

One known example of a photovoltaic device used in a solar cell that converts the energy from sunlight into electrical energy is a thin-film silicon-based photovoltaic device comprising a photovoltaic layer formed by using a plasma enhanced CVD method or the like to deposit thin films of a p-type silicon-based semiconductor (p-layer), an i-type silicon-based semiconductor (i-layer) and an n-type silicon-based semiconductor (n-layer).

Advantages of thin-film silicon-based solar cells include the comparative ease with which the surface area can be increased, and the fact that the film thickness is approximately 1/100th that of a crystalline solar cell, meaning minimal material is required. As a result, thin-film silicon-based solar cells can be produced at lower cost than crystalline solar cells. However, drawbacks of thin-film silicon-based solar cells include lower conversion efficiency than that of crystalline solar cells, and a slow deposition rate, resulting in poor productivity.

A tandem-type silicon-based solar cell in which a photovoltaic layer comprising an i-layer composed of amorphous silicon and a photovoltaic layer comprising an i-layer composed of crystalline silicon are stacked together is effective in improving the conversion efficiency of a thin-film silicon-based solar cell. The crystallinity of the crystalline silicon i-layer and the conversion efficiency of the solar cell are closely correlated, and it is known that the highest conversion efficiency is achieved when the crystalline silicon i-layer exhibits crystallinity that is close to the boundary between amorphism and crystallinity.

The crystallinity of the crystalline silicon i-layer is dependent upon the film deposition conditions such as the substrate temperature during deposition and the hydrogen dilution ratio. The crystallinity is represented, for example, by the ratio 1c/1a in the Raman spectrum between the crystalline silicon peak intensity at 520 cm$^{-1}$ and the amorphous silicon peak intensity at 480 cm$^{-1}$. Patent citation 1 discloses a process for producing a solar cell having high conversion efficiency by depositing the crystalline silicon i-layer under conditions where the substrate temperature Tsub and the ratio 1c/1a satisfy the relational formula 700≦Tsub×1c/1a≦1600.

One technique for improving the mass productivity of solar cells involves forming a crystalline silicon i-layer of uniform crystallinity and thickness to maintain solar cell performance, while increasing the deposition rate. Further, in another technique, a solar cell module is produced using a large surface area substrate. Generally, in the production of large surface area modules using a plasma enhanced CVD method, the crystallinity and film thickness of the crystalline silicon i-layer tend to exhibit distributions within the substrate plane that correspond with the gas flow and the discharge distribution. On the other hand, in order to improve the mass productivity of the solar cell, a larger RF power must be supplied to the plasma electrode to increase the deposition rate of the crystalline silicon i-layer. However, this also increases the plasma discharge distribution within the substrate plane, causing a broadening of the crystallinity and film thickness distributions within the substrate plane. As a result, in the case of a large surface area substrate, depositing the crystalline silicon i-layer uniformly across the substrate plane in order to achieve a level of crystallinity that yields superior performance for the solar cell containing the crystalline silicon i-layer is problematic, and achieving a combination of a high deposition rate and high performance is extremely difficult.

One technique for depositing a crystalline silicon layer of uniform crystallinity and film thickness on a large surface area substrate has been reported in non-patent citation 1, and comprises the deposition of a crystalline silicon layer using a short-pulsed plasma CVD method. In a short-pulsed CVD method, by pulsing an excited plasma, the spatial non-uniformity of the applied electric field during the plasma ON phases is moderated and the spatial distribution of the active species becomes more uniform, leading to improvements in the uniformity of the crystallinity and the film thickness. As a result, a large surface area solar cell having high conversion efficiency can be realized.

Patent Citation 1: Publication of Japanese Patent No. 3,943,080.

Non Patent Citation 1: Y. Fujioka et al., "Large scale, high-efficiency thin-film silicon solar cells fabricated by short-pulsed plasma CVD method", PVSEC14th (Bangkok, 2004 January).

DISCLOSURE OF INVENTION

In the short-pulsed plasma CVD method disclosed in non-patent citation 1, uniform crystallinity and film thickness within the plane are achieved by pulsing of the plasma. However, despite the fact that the active species are generated efficiently so that the deposition rate does not decrease as a result of the pulsing, the deposition rate is still less than that obtained for deposition using a typical continuous plasma. In other words, conventionally there are no techniques available that combine rapid deposition with favorable crystallinity uniformity and film thickness uniformity.

Achieving uniform deposition of a crystalline silicon i-layer within the substrate plane so as to obtain a level of crystallinity that yields superior performance, together with rapid deposition, thereby enabling large surface area solar cell modules comprising a crystalline silicon i-layer to be produced with a combination of superior solar cell mass productivity and superior performance is extremely difficult. Accordingly, in order to achieve both favorable mass productivity and favorable performance for a solar cell, some variation in the in-plane distribution of the crystallinity of the crystalline silicon i-layer must be tolerated, and a permissible range must be set for the in-plane distribution of the crystallinity. It is known that if the crystallinity of the crystalline silicon i-layer is low, then the sensitivity of the layer to light of longer wavelengths (such as wavelengths of 600 nm or more) deteriorates, causing a decrease in the solar cell performance. As a result, it has been thought that the permissible range for the in-plane distribution of the crystallinity within the crystalline silicon i-layer must be set so as to exclude the existence of low crystallinity regions. Here, a "low crystallinity region" refers to a region in which, for example, the ratio within the crystalline silicon layer of the Raman peak intensity for the crystalline silicon phase relative to the Raman peak intensity for the amorphous silicon phase is not more than approximately 3 or 4.

The present invention has been developed in light of the above circumstances, and has an object of providing a large surface area photovoltaic device having high conversion efficiency and excellent mass productivity.

In order to achieve the above object, the present invention provides a photovoltaic device having a photovoltaic layer comprising a crystalline silicon layer formed on a substrate, wherein the crystalline silicon layer has a crystalline silicon i-layer, and the crystalline silicon i-layer has a substrate in-plane distribution represented by an average value for the Raman peak ratio, which represents the ratio of the Raman peak intensity for the crystalline silicon phase relative to the Raman peak intensity for the amorphous silicon phase, that is not less than 4 and not more than 8, a standard deviation for the Raman peak ratio that is not less than 1 and not more than 3, and a proportion of regions in which the Raman peak ratio is not more than 4 of not less than 0% and not more than 15%. The Raman peak ratio is represented by the ratio 1c/1a, within a Raman spectrum measured using laser light having a wavelength of 532 nm, of the peak intensity 1c for the crystalline silicon phase at 520 $cm^{-1}$ relative to the peak intensity 1a for the amorphous silicon phase at 480 $cm^{-1}$.

In order to obtain a photovoltaic device having high conversion efficiency, there is an ideal range for the Raman peak ratio for the crystalline silicon i-layer, and if the Raman peak ratio is too low, then the sensitivity of the i-layer to longer wavelength light having a wavelength 700 nm or longer decreases, resulting in reduced conversion efficiency. However, it was discovered that if regions having a low Raman peak ratio of not more than 4 existed within the substrate plane, then the conversion efficiency actually increased. However, if the proportion of these regions having a Raman peak ratio or not more than 4 exceeds 15%, then not only does the conversion efficiency decrease, but peeling may occur as a result of the stress generated within the substrate plane between the regions having a low Raman peak ratio and the regions having a high Raman peak ratio, which is problematic in terms of long-term stability. A photovoltaic device in which the Raman peak ratio of the crystalline silicon i-layer has a substrate in-plane distribution represented by the distribution described above is a high-output photovoltaic device.

Moreover, the present invention also provides a photovoltaic device having a photovoltaic layer comprising a crystalline silicon layer formed on a substrate, wherein the crystalline silicon layer has a crystalline silicon i-layer, the size of the surface of the substrate on which the photovoltaic layer is formed is at least 1 m square, and the crystalline silicon i-layer has a substrate in-plane distribution represented by an average value for the Raman peak ratio, which represents the ratio of the Raman peak intensity for the crystalline silicon phase relative to the Raman peak intensity for the amorphous silicon phase, that is not less than 5 and not more than 8, a standard deviation for the Raman peak ratio that is not less than 1 and not more than 3, and a proportion of regions in which the Raman peak ratio is not more than 4 of not less than 0% and not more than 10%.

In those cases where the surface of the substrate on which the photovoltaic layer is formed is at least 1 m square, if the proportion of those regions having a Raman peak ratio of not more than 4 exceeds 10%, then the probability of regions of low Raman peak ratio being concentrated within a localized area increases, which can lead to problems such as a tendency for the output of the photovoltaic device to decrease, and an increased chance that peeling may occur within the crystalline silicon layer. In a large surface area photovoltaic device, by ensuring that the Raman peak ratio for the crystalline silicon i-layer has a substrate in-plane distribution represented by the distribution described above, a high-output photovoltaic device can be obtained.

In the present invention, the crystalline silicon i-layer is preferably deposited at a deposition rate of not less than 1.5 nm/sec. Generally, if a crystalline silicon layer is deposited rapidly, then the substrate in-plane distributions for the crystallinity and the film thickness tend to increase. In contrast, with the photovoltaic device of the present invention, even if the crystalline silicon i-layer is deposited at a rapid rate of not less than 1.5 nm/sec, because the crystalline silicon i-layer has a Raman peak ratio within the substrate plane that satisfies the substrate in-plane distribution described above, a high-output photovoltaic device can be obtained with a high degree of productivity. Ensuring favorable productivity for solar cell modules at a deposition rate lower than 1.5 nm/sec would require the installation of a plurality of parallel crystalline silicon i-layer deposition chambers, but this simply leads to dramatic and undesirable increases in plant equipment costs.

In the present invention, the photovoltaic layer may further comprise an amorphous silicon layer, wherein the film thickness of the amorphous silicon i-layer within this amorphous silicon layer is not less than 170 nm and not more than 250 nm.

By setting the film thickness of the amorphous silicon i-layer to a value within the above range, light-induced degradation of the photovoltaic device can be suppressed, and a high stabilized output can be achieved.

In such cases, an intermediate contact layer is preferably provided between the crystalline silicon layer and the amorphous silicon layer. Short wavelength light that is transmitted through the amorphous silicon layer without being completely absorbed is reflected by the intermediate contact layer, thereby lengthening the light path within the amorphous silicon layer and enabling more efficient absorption of the short wavelength light. Further, the intermediate contact layer also improves the contact properties between the crystalline silicon layer and the amorphous silicon layer. As a result, the generated electrical current can be increased without increasing the film thickness of the amorphous silicon layer, meaning a photovoltaic device of high conversion efficiency can be obtained.

According to the present invention, by ensuring that the Raman peak ratio of the crystalline silicon i-layer has a substrate in-plane distribution described above, a photovoltaic device having high conversion efficiency can be obtained even when the crystalline silicon layer is deposited on a large surface area substrate at a rapid deposition rate in order to improve the productivity.

| Explanation of Reference: | |
|---|---|
| 1: | Substrate |
| 2: | Transparent electrode layer |
| 3: | Photovoltaic layer |
| 4: | Back electrode layer |
| 5: | Intermediate contact layer |
| 6: | Solar cell module |
| 31: | Amorphous silicon p-layer |
| 32: | Amorphous silicon i-layer |
| 33: | Amorphous silicon n-layer |
| 41: | Crystalline silicon p-layer |
| 42: | Crystalline silicon i-layer |
| 43: | Crystalline silicon n-layer |
| 91: | First cell layer |
| 92: | Second cell layer |
| 100: | Photovoltaic device |

BEST MODE FOR CARRYING OUT THE INVENTION

A description of an embodiment of a photovoltaic device according to the present invention is presented below.

Figure 1:
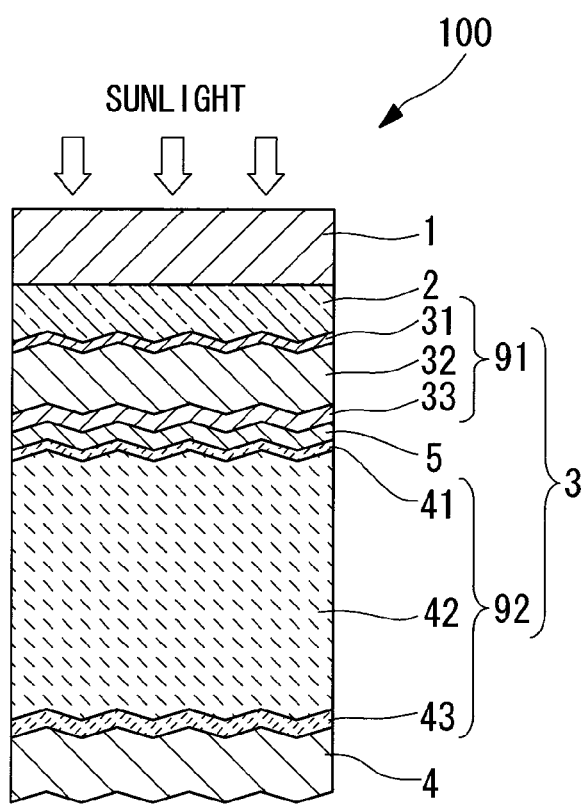
FIG. 1 A cross-sectional view schematically illustrating the structure of a photovoltaic device according to an embodiment of the present invention.

FIG. 1 is a schematic illustration of the structure of a photovoltaic device according to this embodiment. A photovoltaic device 100 is a silicon-based solar cell, and comprises a substrate 1, a transparent electrode layer 2, a first cell layer 91 (an amorphous silicon series) and a second cell layer 92 (a crystalline silicon series) that function as a photovoltaic layer 3, and a back electrode layer 4. Here, the terms "silicon-based" and "silicon series" are generic terms that include silicon (Si), silicon carbide (SiC) and silicon germanium (SiGe). Further, a crystalline silicon series describes a silicon series other than an amorphous silicon series, and includes both microcrystalline silicon series and polycrystalline silicon series.

A description of the steps for producing a photovoltaic device according to the present embodiment is presented below, using a solar cell panel as an example, with reference to FIG. 2 through FIG. 5.

Figure 2:
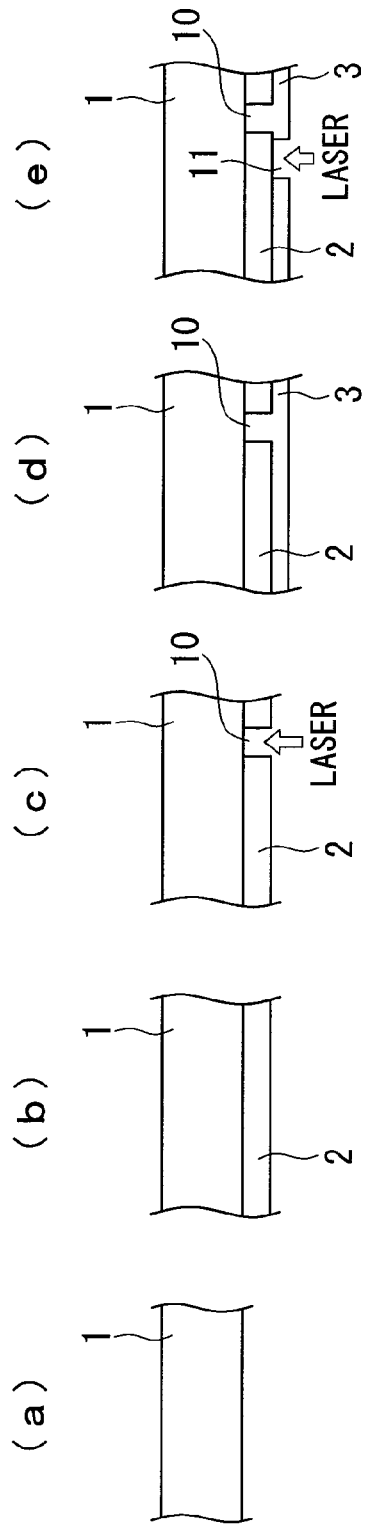
FIG. 2 A schematic illustration describing an embodiment for producing a solar cell panel that represents a photovoltaic device according to the present invention.

(1) FIG. 2(*a*)

A soda float glass substrate (for example, a large surface area substrate of 1.4 m×1.1 m×thickness: 3 to 6 mm, where the length of one side exceeds 1 m) is used as the substrate 1. The edges of the substrate are preferably subjected to corner chamfering or R-face chamfering to prevent damage caused by thermal stress or impacts or the like.

(2) FIG. 2(*b*)

A transparent electrode film comprising mainly tin oxide ($SnO_2$) and having a film thickness of approximately not less than 500 nm and not more than 800 nm is deposited as the transparent electrode layer 2, using a thermal CVD apparatus at a temperature of approximately 500° C. During this deposition, a texture comprising suitable unevenness is formed on the surface of the transparent electrode film. In addition to the transparent electrode film, the transparent electrode layer 2 may include an alkali barrier film (not shown in the figure) formed between the substrate 1 and the transparent electrode film. The alkali barrier film is formed using a thermal CVD apparatus at a temperature of approximately 500° C. to deposit a silicon oxide film ($SiO_2$) having a film thickness of not less than 50 nm and not more than 150 nm.

(3) FIG. 2(*c*)

Subsequently, the substrate 1 is mounted on an X-Y table, and the first harmonic of a YAG laser (1064 nm) is irradiated onto the surface of the transparent electrode layer, as shown by the arrow in the figure. The laser power is adjusted to ensure an appropriate process speed, and the transparent electrode film is then moved in a direction perpendicular to the direction of the series connection of the electric power generation cells, thereby causing a relative movement between the substrate 1 and the laser light, and conducting laser etching across a strip having a predetermined width of approximately 6 mm to 15 mm to form a slot 10.

(4) FIG. 2(*d*)

Using a plasma enhanced CVD apparatus, a p-layer, an i-layer and an n-layer, each composed of a thin film of amorphous silicon, are deposited as the first cell layer 91. Using $SiH_4$ gas and $H_2$ gas as the main raw materials, and under conditions including a reduced pressure atmosphere of not less than 30 Pa and not more than 1,000 Pa and a substrate temperature of approximately 200° C., an amorphous silicon p-layer 31, an amorphous silicon i-layer 32 and an amorphous silicon n-layer 33 are deposited, in this order, on the transparent electrode layer 2, with the p-layer closest to the surface from which incident sunlight enters. The amorphous silicon p-layer 31 is an amorphous B-doped silicon film having a film thickness of not less than 10 nm and not more than 30 nm. The amorphous silicon i-layer 32 has a film thickness of not less than 170 nm and not more than 250 nm. The amorphous silicon n-layer 33 is a P-doped amorphous silicon film having a film thickness of not less than 30 nm and not more than 50 nm. A crystalline silicon n-layer composed of a P-doped crystalline silicon film may be provided instead of the amorphous silicon n-layer. A buffer layer may be provided between the amorphous silicon p-layer 31 and the amorphous silicon i-layer 32 in order to improve the interface properties.

Using a plasma enhanced CVD apparatus, a p-layer, an i-layer and an n-layer, each composed of a thin film of crystalline silicon, are deposited as the second cell layer 92 on top of the first cell layer 91. Using $SiH_4$ gas and $H_2$ gas as the main raw materials, and under conditions including a reduced pressure atmosphere of not more than 3,000 Pa, a substrate temperature of approximately 200° C. and a plasma generation frequency of not less than 40 MHz and not more than 100 MHz, a crystalline silicon p-layer 41, a crystalline silicon i-layer 42 and a crystalline silicon n-layer 43 are deposited in this order.

In the present embodiment, the crystalline silicon p-layer 41 is a B-doped crystalline silicon film having a film thickness of not less than 10 nm and not more than 50 nm. The crystalline silicon i-layer 42 has a film thickness of not less than 1.2 μm and not more than 3.0 μm. The crystalline silicon n-layer

43 is a P-doped crystalline silicon film having a film thickness of not less than 20 nm and not more than 50 nm.

Figure 6:
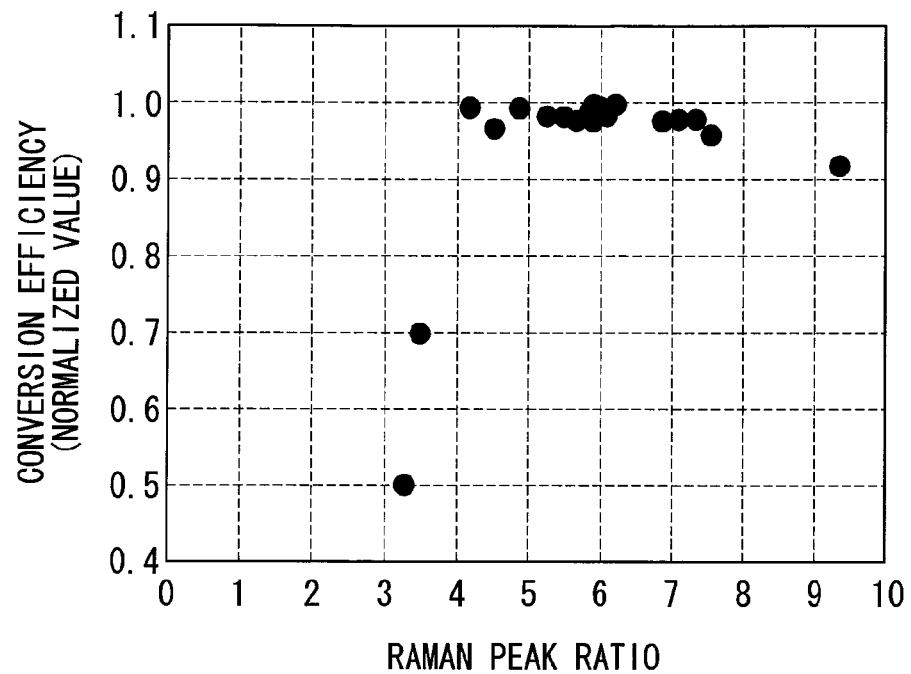
FIG. 6 A graph illustrating the relationship between the Raman peak ratio for the crystalline silicon i-layer and the photovoltaic conversion efficiency in a tandem-type solar cell.

FIG. 6 illustrates the relationship between the Raman peak ratio for the crystalline silicon i-layer and the photovoltaic conversion efficiency in a tandem-type solar cell. In this figure, the horizontal axis represents the Raman peak ratio 1c/1a for the crystalline silicon i-layer, and the vertical axis represents the conversion efficiency (the normalized value) of the tandem-type solar cell. It is evident that when the Raman peak ratio for the crystalline silicon i-layer falls below 4, the photovoltaic conversion efficiency of the cell decreases rapidly. Based on the results of FIG. 6, it could be thought that in a solar cell module using a large surface area substrate, it should be preferable to ensure that the Raman peak ratio for the crystalline silicon i-layer across the entire substrate is set to a value within the range that yields high conversion efficiency for an individual cell. However, in contrast, by ensuring that a predetermined quantity of regions having a Raman peak ratio of 4 or less exist within the substrate plane, the conversion efficiency of the solar cell module can actually be increased.

The Raman peak ratio distribution for the crystalline silicon i-layer can be controlled via the deposition conditions, such as the level of electric power applied to the plasma electrode during deposition and the hydrogen dilution ratio $H_2/SiH_4$. The Raman peak ratio distribution for the crystalline silicon i-layer within the substrate plane is controlled so that the average value of the Raman peak ratio is not less than 4 and not more than 8, the standard deviation is not less than 1 and not more than 3, and the proportion of regions for which the Raman peak ratio is not more than 4 is not less than 0% and not more than 15%, and preferably not less than 2% and not more than 6%. Particularly in those cases where, as in the present embodiment, a large surface area substrate having a size exceeding 1 m square is used, the probability of regions of low Raman peak ratio being concentrated within a localized area increases, and therefore it is desirable that the proportion of regions for which the Raman peak ratio is not more than 4 is suppressed to a value within a predetermined range. Namely, the Raman peak ratio distribution for the crystalline silicon i-layer within the substrate plane is controlled so that the average value of the Raman peak ratio is not less than 5 and not more than 8, the standard deviation is not less than 1 and not more than 3, and the proportion of regions for which the Raman peak ratio is not more than 4 is not less than 0% and not more than 10%, preferably not less than 1% and not more than 7%, and more preferably not less than 2% and not more than 6%.

Because the crystalline silicon i-layer 42 is thicker than the other layers, the deposition rate for the crystalline silicon i-layer is rate controlling for the productivity of the solar cell module. In order to increase the productivity, the crystalline silicon i-layer 42 is formed at a deposition rate of at least 1.5 nm/sec, and preferably 2.0 nm/sec or higher.

In the present embodiment, by ensuring that the thickness of the amorphous silicon i-layer 32 is not less than 170 nm and not more than 250 nm, light-induced degradation of the solar cell can be prevented. In a tandem-type solar cell where an amorphous silicon layer and a crystalline silicon layer are stacked as the photovoltaic layer, the light-induced degradation rate can be suppressed to 10% or less. As a result, the stabilized output can be improved for those situations where the solar cell is used over an extended period exceeding 1,000 hours.

An intermediate contact layer 5 that functions as a semi-reflective film for improving the contact properties between the first cell layer 91 and the second cell layer 92 and achieving electrical current consistency may be provided on the first cell layer 91. For example, a GZO (Ga-doped ZnO) film with a film thickness of not less than 20 nm and not more than 100 nm may be formed as the intermediate contact layer 5 using a DC sputtering apparatus with a Ga-doped ZnO sintered body as the target.

(5) FIG. 2(*e*)

The substrate 1 is mounted on an X-Y table, and the second harmonic of a laser diode excited YAG laser (532 nm) is irradiated onto the film surface of the photovoltaic layer 3, as shown by the arrow in the figure. With the pulse oscillation set to not less than 10 kHz and not more than 20 kHz, the laser power is adjusted so as to achieve a suitable process speed, and laser etching is conducted at a point approximately 100 μm to 150 μm to the side of the laser etching line within the transparent electrode layer 2, so as to form a slot 11. The laser may also be irradiated from the side of the substrate 1. In this case, because the high vapor pressure generated by the energy absorbed by the first cell layer 91 of the photovoltaic layer 3 can be utilized, more stable laser etching processing can be performed. The position of the laser etching line is determined with due consideration of positioning tolerances, so as not to overlap with the previously formed etching line.

Using a sputtering apparatus, an Ag film and a Ti film are deposited sequentially as the back electrode layer 4 under a reduced pressure atmosphere and at a temperature of approximately 150° C. In this embodiment, the back electrode layer 4 is formed by sequentially stacking an Ag film having a thickness of not less than 200 nm and not more than 500 nm, and a highly corrosion-resistant Ti film having a thickness of not less than 10 nm and not more than 20 nm which acts as a protective film. In order to reduce the contact resistance between the n-layer of the second cell layer 92 and the back electrode layer 4 and improve the reflectance, a GZO (Ga-doped ZnO) film with a film thickness of not less than 50 nm and not more than 100 nm may be deposited between the photovoltaic layer 3 and the back electrode layer 4 using a sputtering apparatus. Furthermore, an Al film of not less than 250 nm and not more than 350 nm may be used instead of the Ti film. By using Al instead of Ti, the material costs can be reduced while maintaining the anticorrosion effect.

Figure 3:
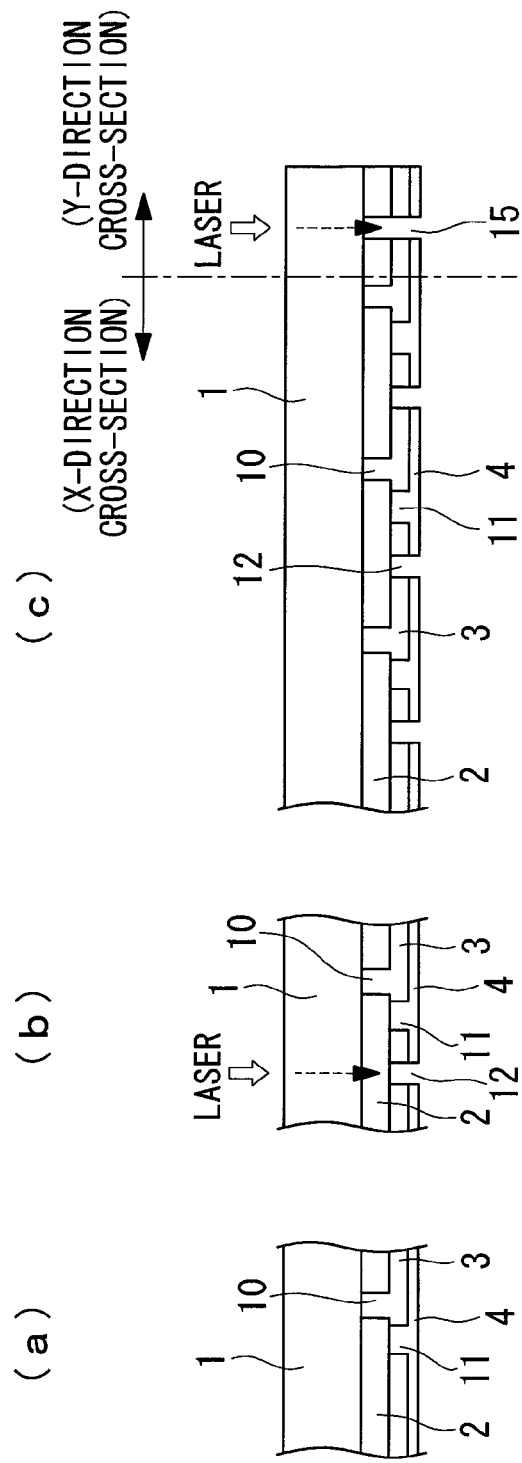
FIG. 3 A schematic illustration describing an embodiment for producing a solar cell panel that represents a photovoltaic device according to the present invention.
Figure 4:
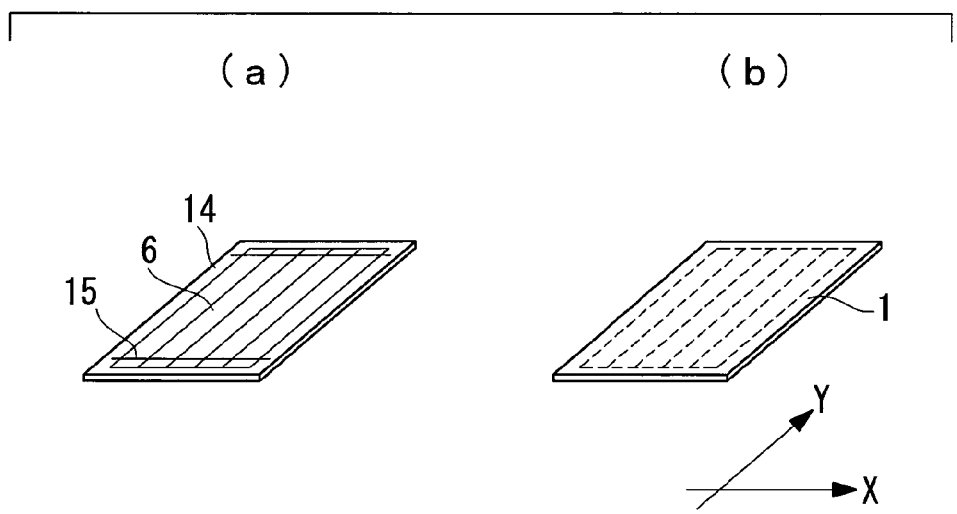
FIG. 4 A schematic illustration describing an embodiment for producing a solar cell panel that represents a photovoltaic device according to the present invention.
Figure 5:
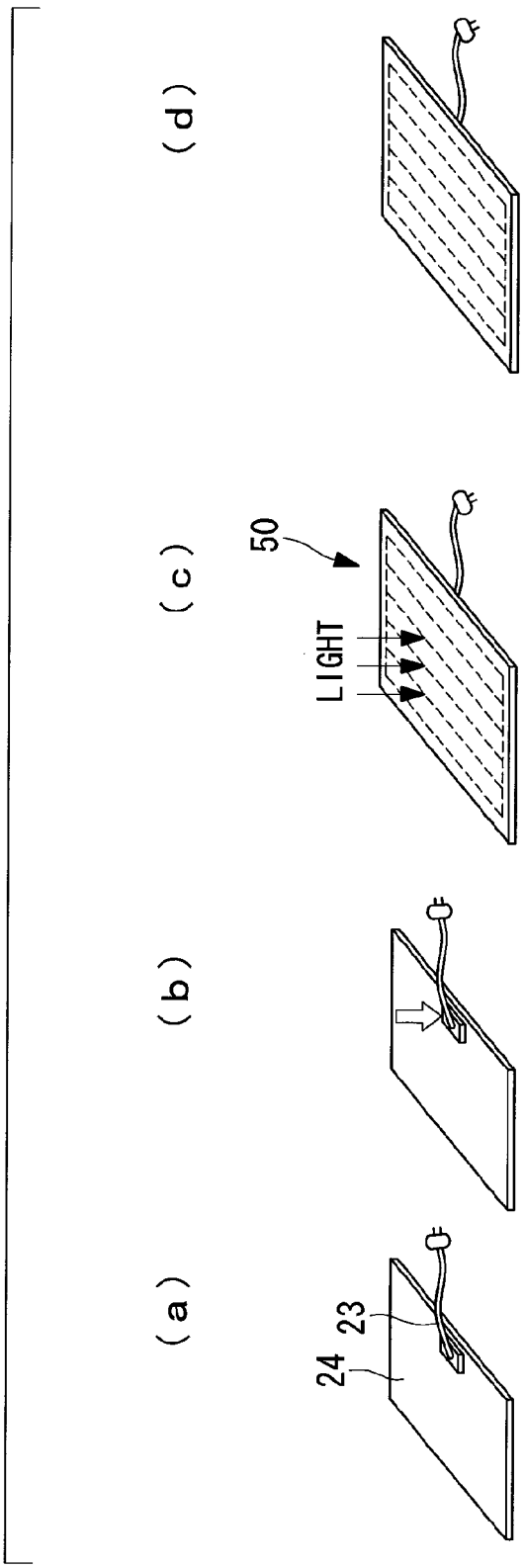
FIG. 5 A schematic illustration describing an embodiment for producing a solar cell panel that represents a photovoltaic device according to the present invention.

(7) FIG. 3(*b*)

The substrate 1 is mounted on an X-Y table, and the second harmonic of a laser diode excited YAG laser (532 nm) is irradiated onto the substrate 1, as shown by the arrow in the figure. The laser light is absorbed by the photovoltaic layer 3, and by utilizing the high gas vapor pressure generated at this point, the back electrode layer 4 is removed by explosive fracture. With the pulse oscillation set to not less than 1 kHz and not more than 10 kHz, the laser power is adjusted so as to achieve a suitable process speed, and laser etching is conducted at a point approximately 250 μm to 400 μm to the side of the laser etching line within the transparent electrode layer 2, so as to form a slot 12.

(8) FIG. 3(*c*)

The electric power generation region is then compartmentalized, by using laser etching to remove the effect wherein the serially connected portions at the film edges near the edges of the substrate are prone to short circuits. The substrate 1 is mounted on an X-Y table, and the second harmonic of a laser diode excited YAG laser (532 nm) is irradiated onto the substrate 1. The laser light is absorbed by the transparent electrode layer 2 and the photovoltaic layer 3, and by utilizing the high gas vapor pressure generated at this point, the back electrode layer 4 is removed by explosive fracture, and the back electrode layer 4, the photovoltaic layer 3 and the transparent electrode layer 2 are removed. With the pulse oscillation set to not less than 1 kHz and not more than 10 kHz, the laser power is adjusted so as to achieve a suitable process speed, and laser etching is conducted at a point approximately 5 mm to 20 mm from the edge of the substrate 1, so as to form an X-direction insulation slot 15 as illustrated in FIG. 3(c). A Y-direction insulation slot need not be provided at this point, because a film surface polishing and removal treatment is conducted on the peripheral regions of the substrate 1 in a later step.

Completing the etching of the insulation slot 15 at a position 5 to 10 mm from the edge of the substrate 1 is preferred, as it ensures that the insulation slot 15 is effective in inhibiting external moisture from entering the interior of the solar cell module 6 via the edges of the solar cell panel.

Although the laser light used in the steps until this point has been specified as YAG laser light, light from a YVO4 laser or fiber laser or the like may also be used in a similar manner.

(9) FIG. 4(a)

In order to ensure favorable adhesion and sealing of a backing sheet 24 via EVA or the like in a subsequent step, the stacked films around the periphery of the substrate 1 (in a peripheral region 14) are removed, as they tend to be uneven and prone to peeling. Grinding or blast polishing or the like is used to remove the back electrode layer 4, the photovoltaic layer 3, and the transparent electrode layer 2 from a region that is 5 mm to 20 mm from the edge around the entire periphery of the substrate 1, is closer to the substrate edge than the insulation slot 15 provided in the above step of FIG. 3(c) in the X direction, and is closer to the substrate edge than the slot 10 near the substrate edge in the Y direction. Grinding debris or abrasive grains are removed by washing the substrate 1.

(10) FIG. 4(b)

A terminal box attachment portion is prepared by providing an open through-window in the backing sheet 24 and exposing a collecting plate. A plurality of layers of an insulating material are provided in this open through-window portion in order to prevent external moisture and the like entering the solar cell module.

Processing is conducted so as to enable current collection, using a copper foil, from the series-connected solar cell electric power generation cell at one end, and the solar cell electric power generation cell at the other end, in order to enable electric power to be extracted from a terminal box portion on the rear surface of the solar cell panel. In order to prevent short circuits between the copper foil and the various portions, an insulating sheet that is wider than the width of the copper foil is provided.

Following arrangement of the collecting copper foil and the like at predetermined positions, the entire solar cell module 6 is covered with a sheet of an adhesive filling material such as EVA (ethylene-vinyl acetate copolymer) arranged so as not to protrude beyond the substrate 1.

A backing sheet 24 with a superior waterproofing effect is positioned on top of the EVA. In this embodiment, in order to achieve a superior waterproofing and moisture-proofing effect, the backing sheet 24 is formed as a three-layer structure comprising a PET sheet, an Al foil, and a PET sheet.

The structure comprising the components up to and including the backing sheet 24 arranged in predetermined positions is subjected to internal degassing under a reduced pressure atmosphere and under pressing at approximately 150° C. to 160° C. using a laminator, thereby causing cross-linking of the EVA that tightly seals the structure.

(11) FIG. 5(a)

A terminal box 23 is attached to the back of the solar cell module 6 using an adhesive.

(12) FIG. 5(b)

The copper foil and an output cable from the terminal box 23 are connected using solder or the like, and the interior of the terminal box is filled and sealed with a sealant (a potting material). This completes the production of the solar cell panel 50.

(13) FIG. 5(c)

The solar cell panel 50 formed via the steps up to and including FIG. 5(b) is then subjected to an electric power generation test, as well as other tests for evaluating specific performance factors. The electric power generation test is conducted using a solar simulator that emits a standard sunlight of AM 1.5 (1,000 W/m$^2$).

(14) FIG. 5(d)

In tandem with the electric power generation test (FIG. 5(c)), a variety of specific performance factors including the external appearance are evaluated.

EXAMPLES

Example 1

Using a CVD method, an amorphous silicon layer and a crystalline silicon layer were formed, as the first cell layer 91 and the second cell layer 92 respectively, on a glass substrate of dimensions 1.4 m×1.1 m, thus forming a tandem-type solar cell module. Deposition of the crystalline silicon i-layer 42 was conducted at a deposition rate of 2 nm/sec, and the electric power applied to the plasma electrode and the hydrogen dilution ratio were adjusted appropriately to control the distribution of the Raman peak ratio within the substrate plane.

Following measurement of the solar cell module output, the substrate was partitioned. Samples were taken from 24 locations within the substrate plane, and following removal of the back electrode layer 4 from each sample by wet etching using hydrogen peroxide (concentration: 30%) and dilute hydrochloric acid (molar concentration: 0.2), the Raman spectrum was measured with the crystalline silicon n-layer 43 exposed at the surface, and the Raman peak ratio 1c/1a was determined.

The output of the produced solar cell module, the distribution range, average value, and standard deviation for the Raman peak ratio for the crystalline silicon i-layer, and the proportion of regions having a Raman peak ratio of not more than 4 are shown in Table 1. The standard deviation was not less than 1 and not more than 3 for all of the samples. The film thickness distribution for the crystalline silicon i-layer was within a range from ±15 to 25% relative to the average film thickness.

TABLE 1

| Raman peak ratio range | Average value | Standard deviation | Proportion of regions having Raman peak ratio of not more than 4 (%) | Module output (W) |
|---|---|---|---|---|
| 5~10 | 7.5 | 1.1 | 0 | 145 |
| 3~11 | 6.5 | 2.2 | 2 | 158 |
| 3~10 | 6.3 | 1.7 | 3 | 160 |
| 1~10 | 5.2 | 2.4 | 6 | 150 |
| 3~9 | 5.8 | 1.4 | 9 | 145 |
| 3~10 | 5.8 | 1.7 | 16 | 140 |
| 2~9 | 5.5 | 1.9 | 31 | 110 |
| 2~8 | 4.8 | 1.7 | 38 | 100 |
| 2~7 | 3.8 | 1.4 | 58 | 80 |

Figure 7:
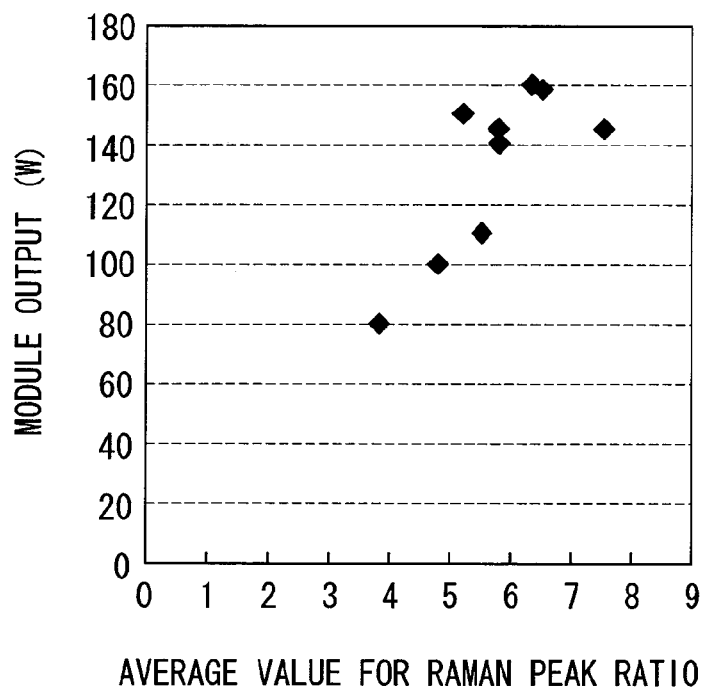
FIG. 7 A graph illustrating the relationship between the average value for the Raman peak ratio for the crystalline silicon i-layer and the module output in a tandem-type solar cell module having a substrate size of 1.4 m×1.1 m.
Figure 8:
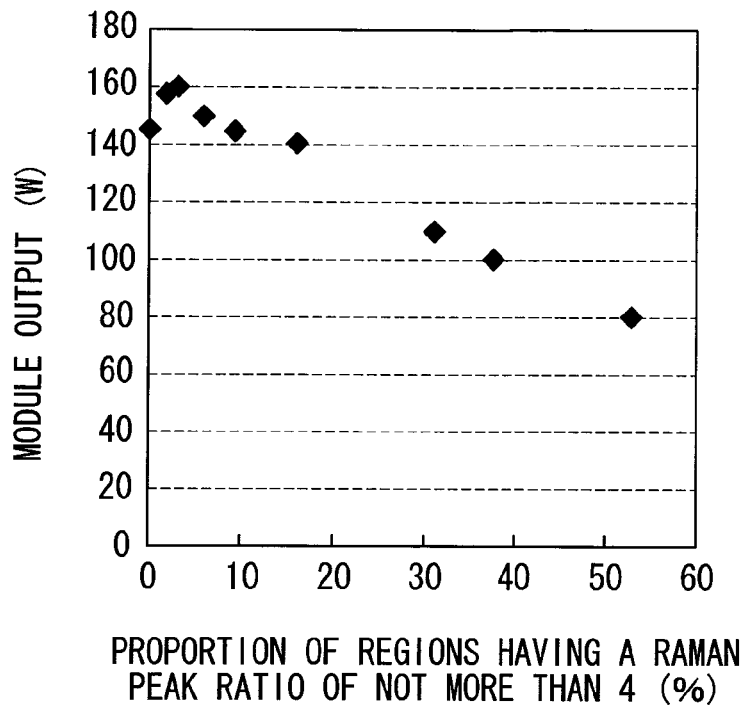
FIG. 8 A graph illustrating the relationship between the proportion of regions within the crystalline silicon i-layer having a Raman peak ratio of not more than 4 and the module output in a tandem-type solar cell module having a substrate size of 1.4 m×1.1 m.

FIG. 7 illustrates the relationship between the average value for the Raman peak ratio for the crystalline silicon i-layer and the solar cell module output in a solar cell module having a substrate size of 1.4 m×1.1 m. In this figure, the horizontal axis represents the average value for the Raman peak ratio, and the vertical axis represents the module output. A high output was obtained for those solar cell modules having an average value of not less than 5 and not more than 8. FIG. 8 illustrates the relationship between the proportion of regions within the crystalline silicon i-layer having a Raman peak ratio of not more than 4 and the module output in a tandem-type solar cell module having a substrate size of 1.4 m×1.1 m. In this figure, the horizontal axis represents the proportion of regions having a Raman peak ratio of not more than 4, and the vertical axis represents the module output. A high output was obtained for proportions of 10% or less. In contrast, once this proportion exceeded 10%, the output exhibited a declining trend. Further, peeling of the crystalline silicon layer was observed within some modules.

As described above, the initial output for a solar cell module having a crystalline silicon i-layer for which the Raman peak ratio within the substrate plane had an average value of not less than 5 and not more than 8 and a standard deviation of not less than 1 and not more than 3, and for which the proportion of regions having a Raman peak ratio of not more than 4 was not more than 10%, was a high output equivalent to at least 90% of the maximum initial output (160 W).

Example 2

Using a CVD method, an amorphous silicon layer and a crystalline silicon layer were formed, as the first cell layer 91 and the second cell layer 92 respectively, on a glass substrate of dimensions 1.4 m×1.1 m. Subsequently, the substrate was divided in two, forming tandem-type solar cell modules of dimensions 0.7 m×1.1 m. Deposition of the crystalline silicon i-layer 42 was conducted at a deposition rate of 2 nm/sec, and the applied electric power and the hydrogen dilution ratio were adjusted appropriately to control the crystallinity distribution within the substrate plane.

Following measurement of the solar cell module output, the substrate was partitioned. The Raman spectrum was measured for samples taken from 24 locations within the substrate plane, and the crystallinity 1c/1a was determined. Prior to measurement of the Raman spectrum, the back electrode layer 4 was removed from each sample using hydrogen peroxide (concentration: 30%) and dilute hydrochloric acid (molar concentration: 0.2), so that the crystalline silicon n-layer 43 was exposed at the surface.

The output of the produced solar cell module, the distribution range, average value, and standard deviation for the Raman peak ratio for the crystalline silicon i-layer, and the proportion of regions having a Raman peak ratio of not more than 4 are shown in Table 2. The standard deviation was not less than 1 and not more than 3 for all of the samples. The film thickness distribution for the crystalline silicon i-layer was within a range from ±15 to 25% relative to the average film thickness.

TABLE 2

| Raman peak ratio range | Average value | Standard deviation | Proportion of regions having Raman peak ratio of not more than 4 (%) | Module output (W) |
|---|---|---|---|---|
| 4~7 | 5.5 | 1.2 | 1 | 80 |
| 4~8 | 6 | 1.3 | 0 | 78 |
| 5~9 | 7 | 1.3 | 0 | 76 |
| 4~6 | 5 | 1.0 | 3 | 84 |
| 3~8 | 5.5 | 1.4 | 8 | 78 |

TABLE 2-continued

| Raman peak ratio range | Average value | Standard deviation | Proportion of regions having Raman peak ratio of not more than 4 (%) | Module output (W) |
|---|---|---|---|---|
| 3~7 | 5 | 1.3 | 10 | 78 |
| 3~6 | 4.5 | 1.2 | 15 | 74 |
| 3~6 | 3.8 | 1.1 | 20 | 58 |
| 2~6 | 3.8 | 1.2 | 30 | 55 |
| 2~6 | 3.3 | 1.1 | 55 | 37 |

Figure 9:
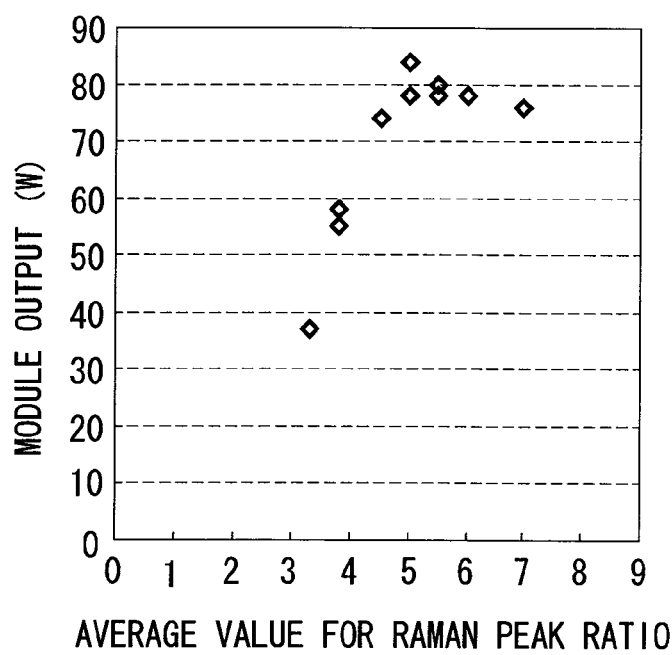
FIG. 9 A graph illustrating the relationship between the average value for the Raman peak ratio for the crystalline silicon i-layer and the module output in a tandem-type solar cell module having a substrate size of 0.7 m×1.1 m.
Figure 10:
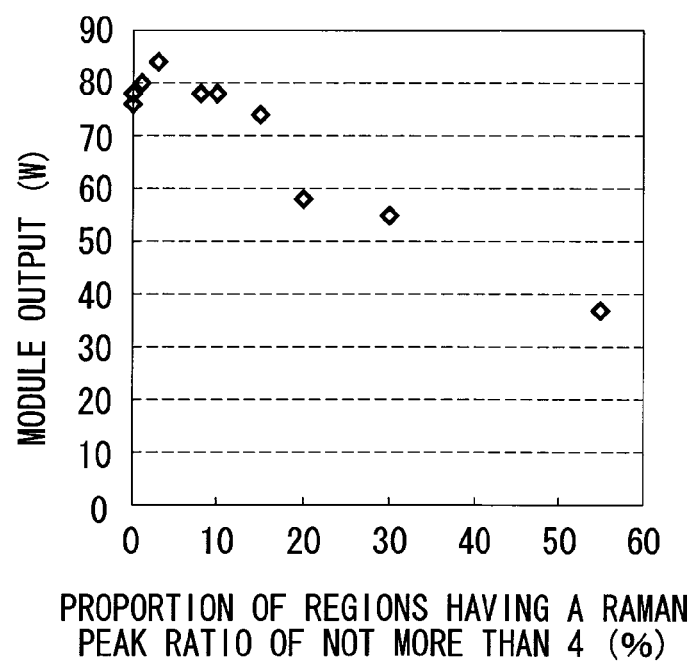
FIG. 10 A graph illustrating the relationship between the proportion of regions within the crystalline silicon i-layer having a Raman peak ratio of not more than 4 and the module output in a tandem-type solar cell module having a substrate size of 0.7 m×1.1 m.

FIG. 9 illustrates the relationship between the average value for the Raman peak ratio and the solar cell module output. In this figure, the horizontal axis represents the average value for the Raman peak ratio, and the vertical axis represents the module output. A high output was obtained for those solar cell modules having an average value of not less than 4 and not more than 8. FIG. 10 illustrates the relationship between the proportion of regions having a Raman peak ratio of not more than 4 and the solar cell module output. In this figure, the horizontal axis represents the proportion of regions having a Raman peak ratio of not more than 4, and the vertical axis represents the module output. A high output was obtained for proportions of 15% or less. In contrast, once this proportion exceeded 15%, the output exhibited a declining trend. Further, peeling of the crystalline silicon i-layer was also observed.

As described above, for a solar cell module having a crystalline silicon i-layer for which the Raman peak ratio within the substrate plane had an average value of not less than 4 and not more than 8 and a standard deviation of not less than 1 and not more than 3, and for which the proportion of regions having a Raman peak ratio of not more than 4 was not more than 15%, a high output equivalent to at least 88% of the maximum initial output (84 W) was obtained.

Example 3

Using a CVD method, a first cell layer 91 comprising an amorphous silicon i-layer having a film thickness of 220 nm or 350 nm was formed on a glass substrate of dimensions 1.4 m×1.1 m. In order not to alter the productivity of the solar cell module, the deposition process was adjusted so that the amorphous silicon i-layers were deposited over the same deposition time. A CVD method was then used to form, on top of the first cell layer 91, a second cell layer 92 having a crystalline silicon i-layer of Example 1, for which the Raman peak ratio exhibited a range from 3 to 10, an average value of 6.3 and a standard deviation of 1.7, and for which the proportion of regions having a Raman peak ratio of not more than 4 was 3% or less, thus completing a tandem-type solar cell module.

Table 3 shows the average film thickness of the amorphous silicon i-layer within the solar cell module, the average film thickness of the crystalline silicon i-layer, and the stabilized output for the solar cell module 1,000 hours after starting electric power generation. The film thickness distributions for the amorphous silicon i-layer and the crystalline silicon i-layer were each within a range from ±15 to 25% relative to the average film thickness.

TABLE 3

| Average film thickness of amorphous silicon i-layer (nm) | Average film thickness of crystalline silicon i-layer (nm) | Stabilized output (W) |
| --- | --- | --- |
| 220 | 2100 | 150 |
| 350 | 2100 | 137 |

As shown in Table 3, by adopting a thin amorphous silicon i-layer having a film thickness of 220 nm, light-induced degradation was controlled, and the stabilized output was able to be increased.

Example 4

A solar cell module comprising an intermediate contact layer 5 having an average film thickness of 50 nm, and a solar cell module having no intermediate contact layer were prepared (each using a substrate of dimensions 1.4 m×1.1 m). In the solar cell module comprising the intermediate contact layer, the film thickness of the amorphous silicon i-layer of the first cell layer 91 was set to 220 nm. In the solar cell module having no intermediate contact layer, the film thickness of the amorphous silicon i-layer was set to 320 nm in order to achieve electric power generation current consistency between the first cell layer and the second cell layer. Moreover, in order not to alter the productivity, the deposition process was adjusted so that the amorphous silicon i-layers were deposited over the same deposition time. In each of the solar cell modules, the second cell layer 92 was formed so that the crystalline silicon i-layer exhibited a Raman peak ratio having a range from 3 to 10, an average value of 6.3 and a standard deviation of 1.7, and had a proportion of regions having a Raman peak ratio of not more than 4 that was 3% or less.

Table 4 shows the average film thickness of the intermediate contact layer of the solar cell module, the average film thickness of the amorphous silicon i-layer, the average film thickness of the crystalline silicon i-layer, and the stabilized output for the solar cell module 1,000 hours after starting electric power generation. The film thickness distributions for the amorphous silicon i-layer and the crystalline silicon i-layer were each within a range from ±15 to 25% relative to the average film thickness.

TABLE 4

| Average film thickness of intermediate contact layer (nm) | Average film thickness of amorphous silicon i-layer (nm) | Average film thickness of crystalline silicon i-layer (nm) | Stabilized output (W) |
| --- | --- | --- | --- |
| 50 nm | 220 | 2100 | 150 |
| None | 320 | 2100 | 131 |

As shown in Table 4, by providing an intermediate contact layer, the film thickness of the amorphous silicon i-layer was able to be reduced. As a result, light-induced degradation was controlled, and the stabilized output was able to be increased.

It should be noted that the present invention is in no way limited by the embodiments described above, and various combinations are possible within the scope of the present.

The invention claimed is:

1. A photovoltaic device comprising:
a substrate; and
a photovoltaic layer comprising a crystalline silicon layer formed on the substrate,
wherein
the crystalline silicon layer has a crystalline silicon i-layer, and
the crystalline silicon i-layer has a substrate in-plane distribution represented by an average value for a Raman peak ratio, which represents
a ratio of a Raman peak intensity for a crystalline silicon phase relative to a Raman peak intensity for an amorphous silicon phase, wherein the Raman peak ratio is not less than 4 and not more than 8,
a standard deviation for the Raman peak ratio that is not less than 1 and not more than 3, and
a proportion of regions, not less than 1% and not more than 3%, in which the Raman peak ratio is not more than 4.

2. The photovoltaic device according to claim 1, wherein the crystalline silicon i-layer is deposited at a deposition rate of not less than 1.5 nm/sec.

3. The photovoltaic device according to claim 2, wherein the photovoltaic layer further comprises an amorphous silicon layer including an amorphous silicon i-layer, and a film thickness of the amorphous silicon i-layer within said amorphous silicon layer is not less than 170 nm and not more than 250 nm.

4. The photovoltaic device according to claim 3, further comprising an intermediate contact layer between the crystalline silicon layer and the amorphous silicon layer.

5. The photovoltaic device according to claim 1, wherein the photovoltaic layer further comprises an amorphous silicon layer including an amorphous silicon i-layer, and a film thickness of the amorphous silicon i-layer within said amorphous silicon layer is not less than 170 nm and not more than 250 nm.

6. The photovoltaic device according to claim 5, further comprising an intermediate contact layer between the crystalline silicon layer and the amorphous silicon layer.

7. A photovoltaic device comprising:
a substrate; and
a photovoltaic layer comprising a crystalline silicon layer formed on the substrate,
wherein
the crystalline silicon layer has a crystalline silicon i-layer,
a size of a surface of the substrate on which the photovoltaic layer is formed is at least 1 m square, and
the crystalline silicon i-layer has a substrate in-plane distribution represented by an average value for a Raman peak ratio, which represents
a ratio of a Raman peak intensity for a crystalline silicon phase relative to a Raman peak intensity for an amorphous silicon phase, wherein the Raman peak ratio is not less than 5 and not more than 8,
a standard deviation for the Raman peak ratio that is not less than 1 and not more than 3, and
a proportion of regions, not less than 2% and not more than 6%, in which the Raman peak ratio is not more than 4.

8. The photovoltaic device according to claim 7, wherein the crystalline silicon i-layer is deposited at a deposition rate of not less than 1.5 nm/sec.

9. The photovoltaic device according to claim 8, wherein the photovoltaic layer further comprises an amorphous silicon layer including an amorphous silicon i-layer, and a film thickness of the amorphous silicon i-layer within said amorphous silicon layer is not less than 170 nm and not more than 250 nm.

10. The photovoltaic device according to claim 9, further comprising an intermediate contact layer between the crystalline silicon layer and the amorphous silicon layer.

11. The photovoltaic device according to claim 7, wherein the photovoltaic layer further comprises an amorphous silicon layer including an amorphous silicon i-layer, and a film thickness of the amorphous silicon i-layer within said amorphous silicon layer is not less than 170 nm and not more than 250 nm.

12. The photovoltaic device according to claim 11, further comprising an intermediate contact layer between the crystalline silicon layer and the amorphous silicon layer.

* * * * *